United States Patent [19]
Matsubara

[11] Patent Number: 5,847,583
[45] Date of Patent: Dec. 8, 1998

[54] SENSE AMPLIFIER CIRCUIT IN WHICH ERRONEOUS READ OPERATION CAN BE PREVENTED

[75] Inventor: Hiroyuki Matsubara, Tokyo, Japan

[73] Assignee: NEC Corporation, Tokyo, Japan

[21] Appl. No.: 851,513

[22] Filed: May 5, 1997

[30] Foreign Application Priority Data

Jun. 14, 1996 [JP] Japan .................................. 8-175621

[51] Int. Cl.$^6$ .............................. G11C 7/06; H03K 5/08
[52] U.S. Cl. ........................... 327/51; 327/310; 327/313; 327/328
[58] Field of Search ................................. 327/51, 54, 57, 327/309, 310, 313, 316, 323, 327, 328

[56] References Cited

U.S. PATENT DOCUMENTS

| | | | |
|---|---|---|---|
| 4,435,658 | 3/1984 | Murray et al. | 327/51 |
| 5,504,442 | 4/1996 | Tanoi | 327/51 |
| 5,619,149 | 4/1997 | Lev et al. | 327/51 |

*Primary Examiner*—Toan Tran
*Attorney, Agent, or Firm*—Sughrue, Mion, Zinn, Macpeak & Seas, PLLC

[57] ABSTRACT

In a sense amplifier circuit, a CMOS inverter is connected to a power supply voltage and inverts and amplifies a voltage on a digit line connected to a selected memory cell of a memory cell section to generate a gate control signal. The first transistor is connected to the digit line and controls current flowing through the digit line in response to the gate control signal. A data of the selected memory cell is outputted from an output of the first transistor. A stabilizing section stabilizes an operation of the CMOS inverter such that a same operation of the CMOS inverter can be performed independent from change of the power supply voltage.

6 Claims, 2 Drawing Sheets

SENSE AMPLIFIER CIRCUIT IN WHICH ERRONEOUS READ OPERATION CAN BE PREVENTED

BACKGROUND OF THE INVENTION

1. Field of the Invention

The present invention relates to a sense amplifier circuit, and more particularly to a sense amplifier circuit in which an erroneous read operation from a semiconductor memory cell can be prevented.

2. Description of the Related Art

FIG. 1 is a circuit diagram illustrating an example of the structure of a sense amplifier circuit of a conventional semiconductor memory device such as a read only memory (ROM). Referring to FIG. 1, the conventional sense amplifier circuit is composed of a P-channel transistor Tr1, an N-channel transistor Tr2, a P-channel transistor Tr3 and an N-channel transistor Tr4. In the P-channel transistor Tr1, the source is connected to a power supply Vcc, and both of the gate and the drain are connected to an output terminal SA. In the N-channel transistor Tr2, the drain is connected to the output terminal SA, the source is connected to a cell section 100 via a node SA1, and the gate is connected to a node SA3. In the P-channel transistor Tr3, the source is connected to the power supply Vcc and the drain is connected to the gate of the N-channel transistor Tr2. In the N-channel transistor Tr4, the drain is connected to the drain of the P-channel transistor Tr3 and the source is grounded. Thus, the P-channel transistor Tr3 and the N-channel transistor Tr4 form a CMOS inverter. Both gates of the P-channel transistor Tr3 and N-channel transistor Tr4 are connected to the source of the N-channel transistor Tr2, i.e., the node SA1. The P-channel transistor Tr3 and the N-channel transistor Tr4 input the source output of the N-channel transistor Tr2, and supply the inverted output of the source output to the gate of the N-channel transistor Tr2, i.e., the node SA3.

Next, the operation of this conventional sense amplifier circuit will be described.

This sense amplifier circuit detects the state in which current Id flows into the cell section 100, i.e., the on state of the cell section 100, and the state in which the current Id does not flow into the cell section 100, i.e., the off state of the cell section. Then, the detecting result is outputted from the node SA.

In the on state of the cell section 100, that is, when a selected one of memory cells of the cell section 100 is in the conductive state, because the current Id flows into the cell section 100, the voltage level of the node SA1 is decreased and the voltage level of the output node SA3 between the transistors Tr3 and Tr4 of the CMOS inverter is increased. As a result, the N-channel transistor Tr2 is set to the on state and the current Id is supplied from the power supply Vcc. When the current Id flows through the N-channel transistor Tr2, the logic level of the output terminal SA which is connected to the drain of the transistor Tr2 changes to the low level. This is a normal read operation from the cell section in the on state.

On the other hand, in the off state of the cell section 100, because the current Id does not flow into the cell section 100, the N-channel transistor Tr4 is set to the on state, and the gate potential of the N-channel transistor Tr2 changes into the ground (GND) level. As a result, the N-channel transistor Tr2 is not set to the conductive state, and the logic level of the output terminal SA is set to the high level.

By the way, when the power supply voltage Vcc changes because of noise and so on, so that the voltage level decreases, the potential of the output SA3 of the CMOS inverter composed of the transistors Tr3 and Tr4 is decreased. In this case, in the on state of the cell section 100, the N-channel transistor Tr2 changes from the on state into the off state. As a result, the current Id which has flowed through the N-channel transistor Tr2 is stopped, and then the voltage level of the output terminal SA of the sense amplifier is increased. Thus, the voltage signal of the cell section 100 in the off state is outputted.

This is the erroneous read operation of the sense amplifier circuit and the erroneous read operation is a problem to be solved in the conventional sense amplifier circuit.

SUMMARY OF THE INVENTION

The present invention is accomplished in the light of the above circumstances. Therefore, an object of the present invention is to provide a sense amplifier circuit in which the read operation is not influenced even if a power supply voltage changes.

In order to achieve an aspect of the present invention, a sense amplifier circuit includes a CMOS inverter connected to a power supply voltage, for inverting and amplifying a voltage on a digit line connected to a selected memory cell of a memory cell section to generate a gate control signal, a first transistor connected to the digit line, for controlling current flowing through the digit line in response to the gate control signal, a data of the selected memory cell being outputted from an output of the first transistor, a stabilizing section for stabilizing an operation of the CMOS inverter such that a same operation of the CMOS inverter can be performed independent from change of the power supply voltage.

When the CMOS inverter includes a second P-channel transistor connected to the power supply voltage and a third N-channel transistor connected between the second transistor and the ground, the stabilizing section includes a capacitor connected between the power supply voltage and a gate of the second transistor, a resistor connected between the gate of the second transistor and the ground, and a go transistor group composed of at least one diode-connected transistor and connected between the power supply voltage and the gate of the second transistor.

In order to achieve another aspect of the present invention, a sense amplifier circuit includes a first P-channel transistor whose source is connected to a power supply voltage, whose gate and drain are connected to an output terminal, a second N-channel transistor whose drain is connected to the output terminal, whose source is connected to a first node which is connected to a selected memory cell of a memory cell section, and whose gate is connected to a second node, a third P-channel transistor whose source is connected to the power supply voltage, whose gate is connected to a third node, and whose drain is connected to the second node, a fourth N-channel transistor whose drain is connected to the second node, whose gate is connected to the first node, and whose source is connected to the ground, and a stabilizing section connected to the gate of the third transistor, for stabilizing a voltage between the gate and source of the third transistor independent from change of the power supply voltage.

In order to achieve still another aspect of the present invention, a sense amplifier circuit includes a first transistor connected to a digit line via a first node, for controlling current flowing through the digit line in response to a gate control signal, the digit line is connected to a memory cell section composed of memory cells, a second P-channel transistor whose source is connected to a power supply voltage, whose gate is connected to a first node, and whose drain is connected to a gate of the first transistor to supply the gate control signal, a third N-channel transistor whose drain is connected to the gate of the first transistor, whose gate is connected to the digit line, and whose source is connected to the ground, and a bias section connected to the first node, for supplying a bias to the first node such that the second transistor always operates in a saturation region regardless of change of the power supply voltage.

DESCRIPTION OF THE PREFERRED EMBODIMENTS

A sense amplifier circuit of the present invention will be described below in detail with reference to the attached drawings.

Figure 1:
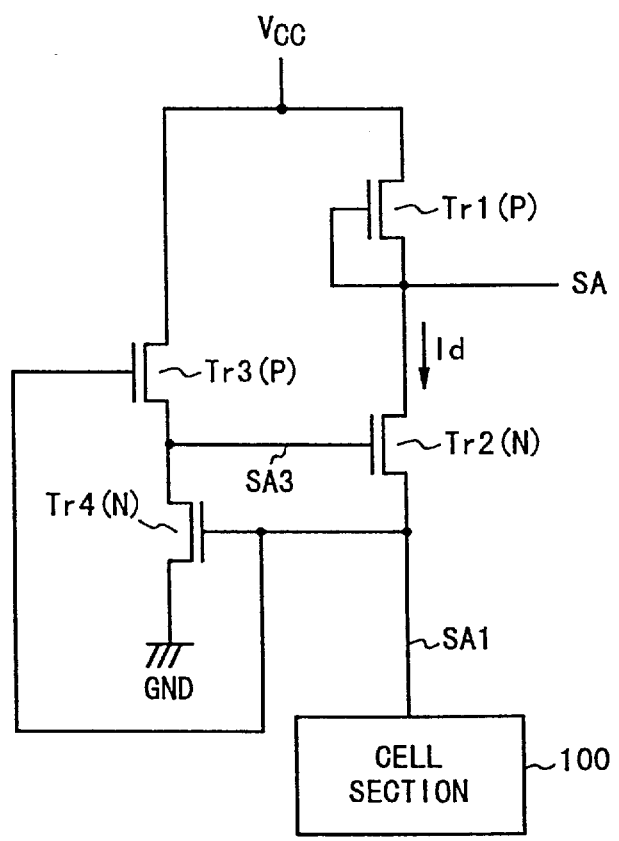
FIG. 1 is a circuit diagram illustrating an example of the structure of a conventional sense amplifier circuit.
Figure 2:
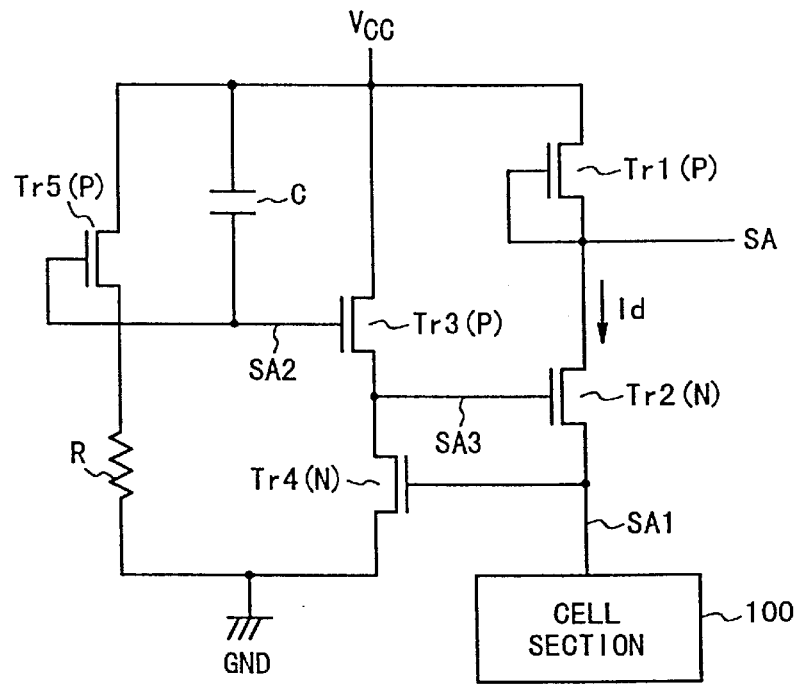
FIG. 2 is a circuit diagram illustrating the circuit structure of a sense amplifier according to the first embodiment of the present invention.

FIG. 2 is a circuit diagram illustrating the structure of the sense amplifier circuit of a memory device such as a read only memory (ROM) according to the first embodiment of the present invention. As shown in FIG. 2, the sense amplifier circuit according to the first embodiment of the present invention is composed of a P-channel transistor Tr1, an N-channel transistor Tr2, a P-channel transistor Tr3, an N-channel transistor Tr4, a P-channel transistor Tr5, a capacitor C and a resistor R.

In the P-channel transistor Tr1, the source is connected to a power supply Vcc and both of the gate and the drain are connected to an output terminal SA. In the N-channel transistor Tr2, the drain is connected to the output terminal SA, the gate is connected to a node SA3, and the source is connected to a node SA1 which is connected to a cell section 100 via a digit line. In the P-channel transistor Tr3, the source is connected to the power supply Vcc and the drain is connected to the gate of the N-channel transistor Tr2, i.e., the node SA3. In the N-channel transistor Tr4, the drain is connected to the drain of the P-channel transistor Tr3, the gate is connected to the source of the N-channel transistor Tr2, i.e., the node SA1, and the source is grounded. In the P-channel transistor Tr5, the source is connected to the power supply Vcc and both of the gate and the drain are connected to the gate of the P-channel transistor Tr3, i.e., a node SA2. The capacitor C is connected between the power supply terminal Vcc and the gate of the P-channel transistor Tr3 as the node SA2. The resistor R is connected between the drain of the P-channel transistor Tr5 at the node SA2 and the ground.

The output voltage signal at the node SA is compared to another reference voltage signal by a differential amplifier (not shown) and a data stored in a selected one of memory cells of the cell section 100 can be read out.

In the sense amplifier circuit, the node SA2 is kept at the potential of {(power supply voltage Vcc)–threshold voltage Vth of transistor Tr5)} by the transistor Tr5 and the resistance R.

The operation to the cell section 100 in the on state will be described.

When current Id flows into the cell section 100, the voltage level of the node SA1 decreases, and the N-channel transistor Tr4 changes to the state having higher resistance. As a result, the voltage level of the node SA3 rises. Thus, the N-channel transistor Tr2 is set to the on state and the current Id is supplied from the power supply terminal Vcc. When the current Id flows through the transistor Tr2, the voltage level of the output terminal SA which is connected to the drain of the N-channel transistor Tr2 changes to the low-level.

On the other hand, because the current Id does not flow through the cell section 100 in the off state of the cell section, the operation opposite to the operation to the cell section 100 in the on state is performed. Thus, the voltage level of the terminal SA is set to the high level.

Next, the case where the power supply voltage Vcc changes because of noise and so on so that the power supply voltage decreases will be described.

When the power supply voltage decreases, the change is transferred to the node SA2 by the capacitor C and the transistor Tr5 in synchronous with the change of the power supply voltage. Therefore, the voltage level of the node SA2 is always kept at a constant voltage level, i.e., {( power supply voltage Vcc)–(threshold value Vth of transistor Tr5) }. In this manner, the constant voltage is always applied between the gate and source of the P-channel transistor Tr3 as the voltage Vgs. In this case, the P-channel transistor Tr3 operates in a saturated area.

Therefore, the current which flows through the P-channel transistor Tr3 is also kept constant, and the voltage level of the node SA3 which is connected to the drain of the P-channel transistor Tr3 is approximately kept constant. Because this node SA3 is connected to the gate of the N-channel transistor Tr2, the voltage Vgs which is applied between the gate and source of the N-channel transistor Tr2 is approximately kept constant. Thus, the change of the current Id which flows through the N-channel transistor Tr2 can be suppressed.

As described above, in the sense amplifier circuit according to the first embodiment of the present invention, the state can be prevented in which the current Id is decreased so that the voltage signal indicative of the off state of the cell section 100 is outputted, when the power supply voltage decreases due to noise.

Figure 3:
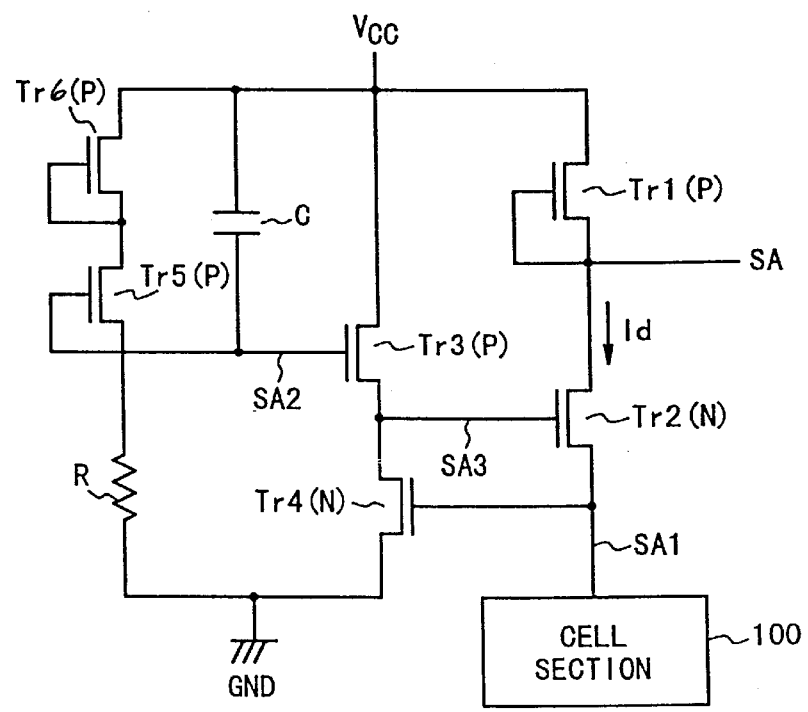
FIG. 3 is a circuit diagram illustrating a circuit structure of a sense amplifier according to the second embodiment of the present invention.

FIG. 3 is a circuit diagram illustrating the structure of the sense amplifier circuit according to the second embodiment of the present invention. Referring to FIG. 3, a P-channel transistor Tr6 is added to the first embodiment which was described above with reference to FIG. 2, such that the P-channel transistor Tr6 is connected to the P-channel transistor Tr5 in series.

The operation of the sense amplifier circuit according to the second embodiment of the present invention is the same as the operation which was described in the above first embodiment.

However, because the P-channel transistor Tr6 is provided in series with the P-channel transistor Tr5, the voltage level of the node SA2 is {(power supply voltage Vcc)–(threshold voltage of transistor Tr5)–(threshold voltage of transistor Tr6)}.

The voltage which is applied between the gate and the sources of the P-channel transistor Tr3 becomes high, and then the P-channel transistor Tr3 always works in the on state. The voltage which is applied between the gate and source of the P-channel transistor Tr3 becomes larger, compared to the case of the first embodiment. Therefore, the P-channel transistor Tr3 always operates in the on state.

As a result, the mutual conductance gm of the P-channel transistor Tr3 is improved, compared to the above first embodiment, and current which flows through the P-channel transistor Tr3 can be stabilized. Thus, the voltage level of the node SA3 can be further stabilized against the change of the power supply voltage. In this manner, the current Id which flows through the N-channel transistor Tr2 can be further stabilized.

As described above, according to the present invention, because the gate voltage of the transistor Tr2 which is inserted between the output terminal SA and the cell section 100 is kept constant even if the power supply voltage changes, the current which flows through the transistor Tr2 can be kept constant. As a result, the voltage level of the output terminal SA can be stabilized and the erroneous read operation from the cell section 100 can be prevented.

In the above description, the sense amplifier circuit of the read only memory was described. However, the present invention is not limited to the read only memory but can be applied to a random access memory. Also, in the embodiments, a diode-connected transistor is used. However, a diode may be used in place of the diode-connected transistor.

What is claimed is:

1. A sense amplifier circuit comprising:
   a CMOS inverter connected to a power supply voltage, for inverting and amplifying a voltage on a digit line connected to a selected memory cell of a memory cell section to generate a gate control signal;
   a first transistor connected to the digit line, for controlling current flowing through the digit line in response to the gate control signal, a data of the selected memory cell being outputted from an output of the first transistor;
   a stabilizing section connected to the CMOS inverter for stabilizing an operation of the CMOS inverter such that a same operation of the CMOS inverter can be performed independent from change of the power supply voltage.

2. A sense amplifier circuit according to claim 1, wherein the CMOS inverter includes a second P-channel transistor connected to the power supply voltage and a third N-channel transistor connected between the second transistor and the ground, and the stabilizing section includes:
   a capacitor connected between the power supply voltage and a gate of the second transistor;
   a resistor connected between the gate of the second transistor and the ground; and
   a transistor group composed of at least one diode-connected transistor and connected between the power supply voltage and the gate of the second transistor.

3. A sense amplifier circuit comprising:
   a first P-channel transistor whose source is connected to a power supply voltage, whose gate and drain are connected to an output terminal;
   a second N-channel transistor whose drain is connected to the output terminal, whose source is connected to a first node which is connected to a selected memory cell of a memory cell section, and whose gate is connected to a second node;
   a third P-channel transistor whose source is connected to the power supply voltage, whose gate is connected to a third node, and whose drain is connected to the second node;
   a fourth N-channel transistor whose drain is connected to the second node, whose gate is connected to the first node, and whose source is connected to the ground; and
   a stabilizing section connected to the gate of the third transistor, for stabilizing a voltage between the gate and source of the third transistor independent from change of the power supply voltage.

4. A sense amplifier circuit according to claim 3, wherein the stabilizing section includes:
   a capacitor connected between the power supply voltage and the third node;
   a resistor connected between the third node and the ground; and
   a transistor group composed of at least one diode-connected transistor and connected between the power supply voltage and the third node.

5. A sense amplifier circuit comprising:
   a first transistor connected to a digit line, for controlling current flowing through the digit line in response to a gate control signal, the digit line is connected to a memory cell section composed of memory cells;
   a second P-channel transistor whose source is connected to a power supply voltage, whose gate is connected to a first node, and whose drain is connected to a gate of the first transistor to supply the gate control signal;
   a third N-channel transistor whose drain is connected to the gate of the first transistor, whose gate is connected to the digit line, and whose source is connected to the ground; and
   a bias section connected to the first node, for supplying a bias to the first node such that the second transistor always operates in a saturation region regardless of change of the power supply voltage.

6. A sense amplifier circuit according to claim 5, wherein the bias section includes:
   a capacitor connected between the power supply voltage and a gate of the second transistor;
   a resistor connected between the gate of the second transistor and the ground; and
   a transistor group composed of at least one diode-connected transistor and connected between the power supply voltage and the gate of the second transistor.

* * * * *